US007957167B2

(12) United States Patent
Yamaguchi et al.

(10) Patent No.: US 7,957,167 B2
(45) Date of Patent: Jun. 7, 2011

(54) SEMICONDUCTOR ELEMENT DRIVE DEVICE WITH LEVEL SHIFT CIRCUIT AND APPARATUS INCLUDING THE SAME

(75) Inventors: Koji Yamaguchi, Katori (JP); Naoki Sakurai, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 466 days.

(21) Appl. No.: 11/802,746

(22) Filed: May 24, 2007

(65) Prior Publication Data
US 2007/0285046 A1    Dec. 13, 2007

(30) Foreign Application Priority Data

May 25, 2006   (JP) .................................. 2006-145031

(51) Int. Cl.
*H02M 7/5387* (2007.01)
(52) U.S. Cl. .......................................... 363/132; 363/98
(58) Field of Classification Search .................. 323/282; 363/17, 98, 132
See application file for complete search history.

(56) References Cited

U.S. PATENT DOCUMENTS

| 6,674,268 | B2 * | 1/2004 | Rutter et al. ................ 323/224 |
| 6,774,674 | B2 * | 8/2004 | Okamoto et al. ............ 326/80 |
| 6,897,682 | B2 * | 5/2005 | Nadd ............................ 326/83 |
| 6,979,981 | B2 * | 12/2005 | Yoshikawa .................... 323/225 |
| 7,236,020 | B1 * | 6/2007 | Virgil .............................. 327/108 |
| 2002/0089321 | A1 * | 7/2002 | Matsuda ........................ 324/142 |
| 2003/0016054 | A1 | 1/2003 | Okamoto et al. |
| 2003/0169611 | A1 * | 9/2003 | Nishizawa et al. ........... 363/132 |
| 2004/0130307 | A1 * | 7/2004 | Dequina et al. ................ 323/282 |
| 2005/0144539 | A1 * | 6/2005 | Orita .............................. 714/48 |
| 2007/0210780 | A1 | 9/2007 | Kataoka |

FOREIGN PATENT DOCUMENTS

| JP | 9-172366 A | 6/1997 |
| JP | 2003-101391 A | 4/2003 |
| JP | 2005-304113 A | 10/2005 |
| JP | 2007-243254 A | 9/2007 |

OTHER PUBLICATIONS

Chinese Office Action dated Oct. 10, 2008 with partial English translation (Nine (9) pages).
Japanese Office Action dated Sep. 24, 2008 (Three (3) pages).

* cited by examiner

*Primary Examiner* — Harry Behm
*Assistant Examiner* — Matthew Grubb
(74) *Attorney, Agent, or Firm* — Crowell & Moring LLP

(57) ABSTRACT

A high-reliability IGBT drive device in which the high- and low-voltage side IGBTs are complementarily ON/OFF controlled before and after dead time. A reset pulse that turns OFF the high-voltage side IGBT is generated during the dead time as described in the following example. The reset pulse is generated immediately before an ON instruction for the low-voltage side IGBT, so that a period that begins immediately before the ON instruction for the low-voltage side IGBT and overlaps with the ON instruction, continuously during the dead time, continuously during dead time immediately before the low-voltage side IGBT turns ON, or in such a manner as to invalidate the ON instruction for the low-voltage side IGBT when an ON state of the high-voltage side IGBT is observed.

8 Claims, 8 Drawing Sheets

SEMICONDUCTOR ELEMENT DRIVE DEVICE WITH LEVEL SHIFT CIRCUIT AND APPARATUS INCLUDING THE SAME

BACKGROUND OF THE INVENTION

1. Field of the Invention

The present invention relates to a semiconductor element drive device, a power conversion device having the semiconductor element drive device, a motor drive device, a semiconductor element drive method, a power conversion method, and a motor drive method.

2. Description of the Related Art

In a power conversion device in which high- and low-voltage side semiconductor elements are series-connected between main power supply terminals to form high- and low-voltage side arms, the high-voltage side semiconductor element is driven at a floating potential. Therefore, a drive circuit for the high-voltage side semiconductor element uses an insulated power supply. Further, a level shift circuit is necessary because a low-voltage side circuits transmits a drive signal to a high-voltage side circuit. The level shift circuit generally includes a pulse generation circuit and two nMOS-FETs. The pulse generation circuit generates a set pulse and reset pulse from the drive signal. The generated set pulse and reset pulse become gate inputs for the nMOS-FETs. It is demanded that this type of power conversion device exhibit, for instance, high withstand voltage, low loss, and high reliability.

In the power conversion device, the potential of a connection point between the low- and high-voltage side semiconductor elements suddenly changes from a ground potential of the low-voltage side semiconductor element to a main power supply voltage. In this instance, a parasitic capacitance exists between a drain and a source of the nMOS-FETs, which constitute the level shift circuit. Therefore, a current simultaneously flows to the two nMOS-FETs, which constitute the level shift circuit, due to a drastic potential change (dV/dt=great). The flow of such a current may transmit a wrong signal to a high-voltage side control circuit, thereby causing the high-voltage side semiconductor element to erroneously turn ON/OFF.

JP-A-1997-172366 and JP-A-2005-304113 call a drastic potential change at a series connection point a self-excited or separately-excited dV/dt, and disclose measures for preventing the level shift circuit from malfunctioning due to the self-excited or separately-excited dV/dt. More specifically, JP-A-1997-172366 avoids malfunction by providing the high-voltage side control circuit with a filter circuit, whereas JP-A-2005-304113 integrates the difference between a set signal and a reset signal and transmits a control signal to avoid malfunction.

SUMMARY OF THE INVENTION

As disclosed in JP-A-1997-172366 and JP-A-2005-304113, a filter or the like is used to avoid malfunction that may occur due to great dV/dt. In a power conversion device, however, various types of great dV/dt arise. Further, as the withstand voltage and output of the power conversion device are increased, a wider variety of dV/dt tend to occur. For example, high dV/dt, long-duration dV/dt, and high-frequency vibration occur. Therefore, the aforementioned semiconductor element drive device configuration cannot completely avoid malfunction due to dV/dt. In addition, the aforementioned configuration cannot correct a malfunction if it should occur.

An object of the present invention is to increase the dV/dt resistance of a semiconductor element drive device.

Another object of the present invention is to provide a semiconductor element drive device that is capable of preventing serious accidents such as an upper/lower arm short circuit in the event of a malfunction, a power conversion device having the semiconductor element drive device, and a motor drive device.

Still another object of the present invention is to provide a semiconductor element drive method for increasing the dV/dt resistance of the semiconductor element drive device and preventing serious accidents such as an upper/lower arm short circuit in the event of a malfunction, a power conversion method for use with the semiconductor element drive method, and a motor drive method.

According to an aspect of the present invention, there is provided a semiconductor element drive device or method for driving a low-voltage side semiconductor element, which is one of two semiconductor elements that are series-connected between main power supply terminals, with reference to a ground potential of the low-voltage side semiconductor element; driving a high-voltage side semiconductor element by a high-voltage side drive circuit that is referenced to a potential of a series connection point between the semiconductor elements; generating a set pulse signal and a reset pulse signal, which serve as an ON instruction and an OFF instruction for the high-voltage side semiconductor element, with reference to the ground potential of the low-voltage side semiconductor element; shifting the levels of the set pulse signal and reset pulse signal toward a high-voltage side that is referenced to the potential of the series connection point and transmitting the resulting set pulse signal and reset pulse signal to the high-voltage side drive circuit; turning ON/OFF the two semiconductor elements complementarily before and after dead time during which the semiconductor elements are both OFF; wherein the reset pulse signal is generated during the dead time.

According to another aspect of the present invention, there is provided the semiconductor element drive device or method, wherein a reset pulse is generated immediately before an ON instruction for the low-voltage side semiconductor element.

According to another aspect of the present invention, there is provided the semiconductor element drive device or method, wherein a reset pulse is generated that begins immediately before the ON instruction for the low-voltage side semiconductor element and overlaps with the ON instruction for the low-voltage side semiconductor element.

According to another aspect of the present invention, there is provided the semiconductor element drive device or method, wherein a reset pulse is continuously output during the dead time during which the high- and low-voltage side semiconductor elements are both OFF.

According to another aspect of the present invention, there is provided the semiconductor element drive device or method, wherein a reset pulse is continuously output during the dead time during which the high- and low-voltage side semiconductor elements are both OFF immediately before the low-voltage side semiconductor element turns ON.

According to still another aspect of the present invention, there is provided the semiconductor element drive device or method, wherein the ON instruction for the low-voltage side semiconductor element is invalidated when an ON state of the high-voltage side semiconductor element is observed.

Preferred embodiments of the present invention provide a semiconductor element drive device and method, a power conversion device and method, or a motor drive device and method for increasing the dV/dt resistance of a series connection point between semiconductor elements, preventing accidents such as an upper/lower arm short circuit, and offering high reliability and high withstand voltage.

Other objects and features of the present invention will be apparent from the detailed description of the preferred embodiments which follows.

DETAILED DESCRIPTION OF THE PREFERRED EMBODIMENTS

Embodiments of the present invention will now be described in detail with reference to the accompanying drawings.

First Embodiment

Figure 1:
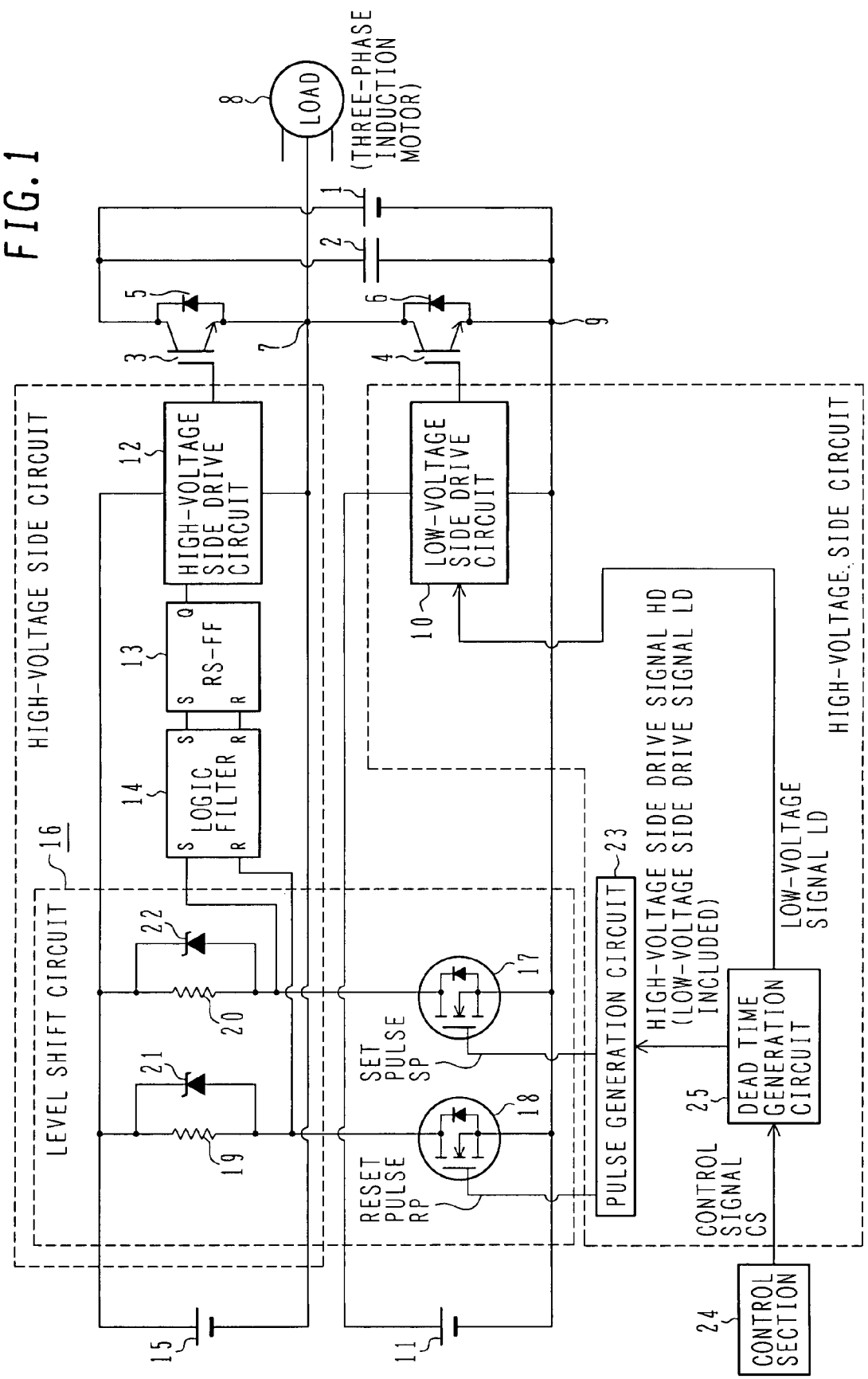
FIG. 1 shows the overall configuration of a motor drive device that uses a power semiconductor element drive device according to a first embodiment of the present invention.

FIG. 1 illustrates the overall configuration of a motor drive device that uses a power semiconductor element drive device according to a first embodiment of the present invention. In reality, a common device configuration is such that three-phase AC power is output to supply power to a three-phase induction motor or other load. For the sake of explanation, however, the figure shows only one phase.

An IGBT (insulated gate bipolar transistor) 3, which is a high-voltage side semiconductor element, and an IGBT 4, which is a low-voltage side semiconductor element, are series-connected to both ends of a main power supply 1 and a smoothing capacitor 2. Free-wheel diodes 5, 6 are connected in inverse parallel with the IGBTs 3, 4, respectively. A series connection point 7 between the IGBTs 3, 4 is an AC power output point to which a load (e.g., three-phase induction motor) 8 is connected.

Although the present embodiment uses the IGBTs as semiconductor switching elements, MOS-FETs may be alternatively used. If the MOS-FETs are used, the free wheel diodes 5 and 6 need not be used.

The low-voltage side IGBT 4 operates with reference to a ground potential 9. A power supply 11 supplies power to a drive circuit 10 for the low-voltage side IGBT. Although the drive circuit 10 often includes a protection circuit, it is merely referred to as the drive circuit.

An insulated power supply 15 supplies power to a drive circuit 12 for driving the high-voltage side IGBT 3, an RS flip-flop 13, and a logic filter 14. As is the case with the drive circuit 10, the drive circuit 12 often includes a protection circuit. However, it is merely referred to as the drive circuit. The logic filter 14 is a circuit that shuts off signals when it receives both a set pulse signal and a reset pulse signal. This circuit prevents a malfunction that may occur due, for instance, to a voltage change dV/dt at the series connection point 7.

A level shift circuit 16 includes an nMOS-FET 17 for set pulse signal transmission, an nMOS-FET 18 for reset pulse signal transmission, resistors 19, 20, and zener diodes 21, 22. When a set pulse SP is output from a pulse generation circuit 23, the nMOS-FET 17 conducts, causing a voltage drop across the resistor 20 and transmitting a set pulse signal to a high-voltage potential side. The set pulse signal transmitted to the high-voltage potential side travels through the logic filter 14, RS flip-flop 13, and drive circuit 12 and turns ON the IGBT 3. When a reset pulse RP is output from the pulse generation circuit 23, the nMOS-FET 18 conducts, causing a voltage drop across the resistor 19 and transmitting a reset pulse signal to the high-voltage potential side. The reset pulse signal transmitted to the high-voltage potential side travels through the logic filter 14, RS flip-flop 13, and drive circuit 12 and turns OFF the IGBT 3. The Zener diodes 21 and 22 suppress overvoltage to protect peripheral circuits.

A control section 24 outputs a control signal CS, which is an ON/OFF instruction for the IGBTs 3, 4. When, for instance, the load 8 is a three-phase induction motor, and its speed is to be controlled, the output voltage and output frequency of an inverter that includes the IGBTs 3, 4 are controlled in accordance with the deviation between a speed instruction and actual speed so that the speed of the three-phase induction motor approaches a value prescribed by the speed instruction. The control signal CS may be regarded as an ON/OFF instruction for the IGBTs 3, 4 that is derived from the control system described above.

A dead time generation circuit 25 receives the control signal CS from the control section 24, obtains dead time DT, and generates a low-voltage side drive signal LD and a high-voltage side drive signal HD.

To increase the withstand voltages and outputs of the semiconductor element drive device, power conversion device, and motor drive device, the present embodiment uses separate silicon chips as the set pulse signal transmission nMOS-FET 17, reset pulse signal transmission nMOS-FET 18, low-voltage side circuit 10, and high-voltage side circuit. An MCM (multi-chip module) structure or SIP (system in package) structure is employed so that these separate silicon chips are fastened to an insulated substrate, wired, and packaged with resin. Alternatively, however, an SOC (system on chip) structure may be employed so that all semiconductor circuits are integrated into a single silicon chip.

An operation of the first embodiment will now be described with reference to FIG. 2.

Figure 2:
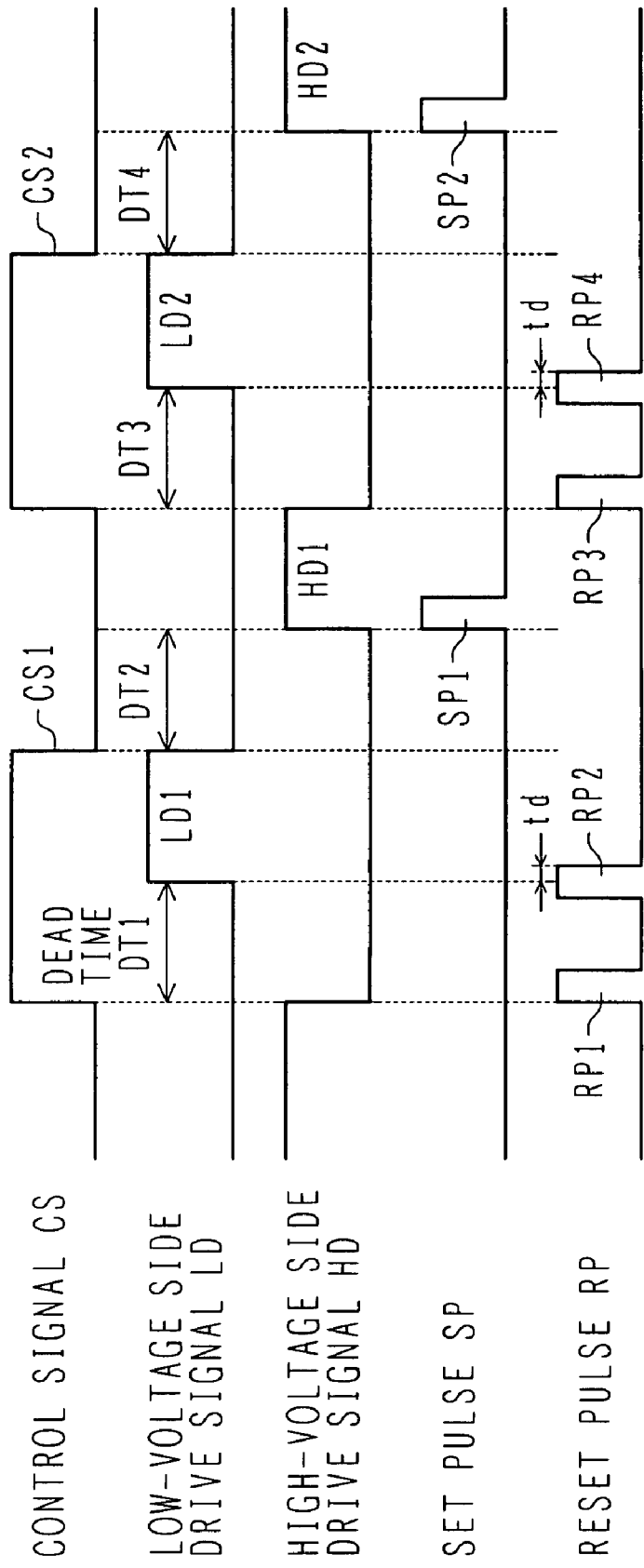
FIG. 2 is a level shift operation timing diagram according to the first embodiment of the present invention.

FIG. 2 is a level shift operation timing diagram according to the first embodiment of the present invention. When the control signal CS is High, it is a low-voltage side IGBT ON instruction (high-voltage side IGBT OFF instruction) CS1, CS2 . . . When the control signal CS is Low, it is a high-voltage side IGBT ON instruction (low-voltage side IGBT OFF instruction). Upon receipt of the control signal CS, the dead time generation circuit 25 generates the low-voltage side drive signal LD and high-voltage side drive signal HD, which are used to turn ON/OFF the two IGBTs complementarily before and after dead time during which the IGBTs are both OFF. The low-voltage side drive signal LD and high-voltage side drive signal HD are ON instructions when they are High and OFF instructions when they are Low. Dead times DT1 to DT4 are provided to avoid an upper/lower arm short circuit.

The low-voltage side drive signal LD directly goes to the low-voltage side drive circuit 10 and serves as a gate signal for the low-voltage side IGBT.

On the high-voltage side, on the other hand, the pulse generation circuit 23 generates a set pulse SP and reset pulse RP for generating a gate signal for the high-voltage side IGBT in accordance with the high-voltage side drive signal HD (including the low-voltage side drive signal LD as needed). Consequently, the high-voltage side IGBT is turned ON by set pulses SP1 and SP2 that prevail when dead time DT2 or DT4 elapses after the falling edge of control signal CS1 or CS2. Reset pulses RP1 and RP3 serve as OFF instructions for the high-voltage side IGBT 3 that correspond to the rise of the control signal CS. In this instance, the rises of reset pulses RP2 and RP4 overlap with those of low-voltage side drive signals LD1 and LD2 for a short period of time td in consideration of turn-ON delay time.

As described above, the pulse generation circuit 23 according to the first embodiment includes circuit means for generating reset pulses PR2 and PR4 during dead times DT1 and DT3. The circuit means generates reset pulses PR2 and RP4 immediately before the ON instructions LD1, LD2 for the low-voltage side IGBT 4. Further, the circuit means generates reset pulses PR2 and RP4 that begin immediately before the ON instructions LD1 and LD2 for the low-voltage side IGBT and overlap with the ON instructions for the low-voltage side IGBT for period td.

Consequently, an upper/lower arm short circuit can be avoided even if the high-voltage side IGBT 3 erroneously turns ON during dead time DT1 or DT3 due, for instance, to a potential change dV/dt at the series connection point 7 between IGBTs 3 and 4.

Second Embodiment

A second embodiment of the present invention will now be described with reference to FIG. 3.

Figure 3:
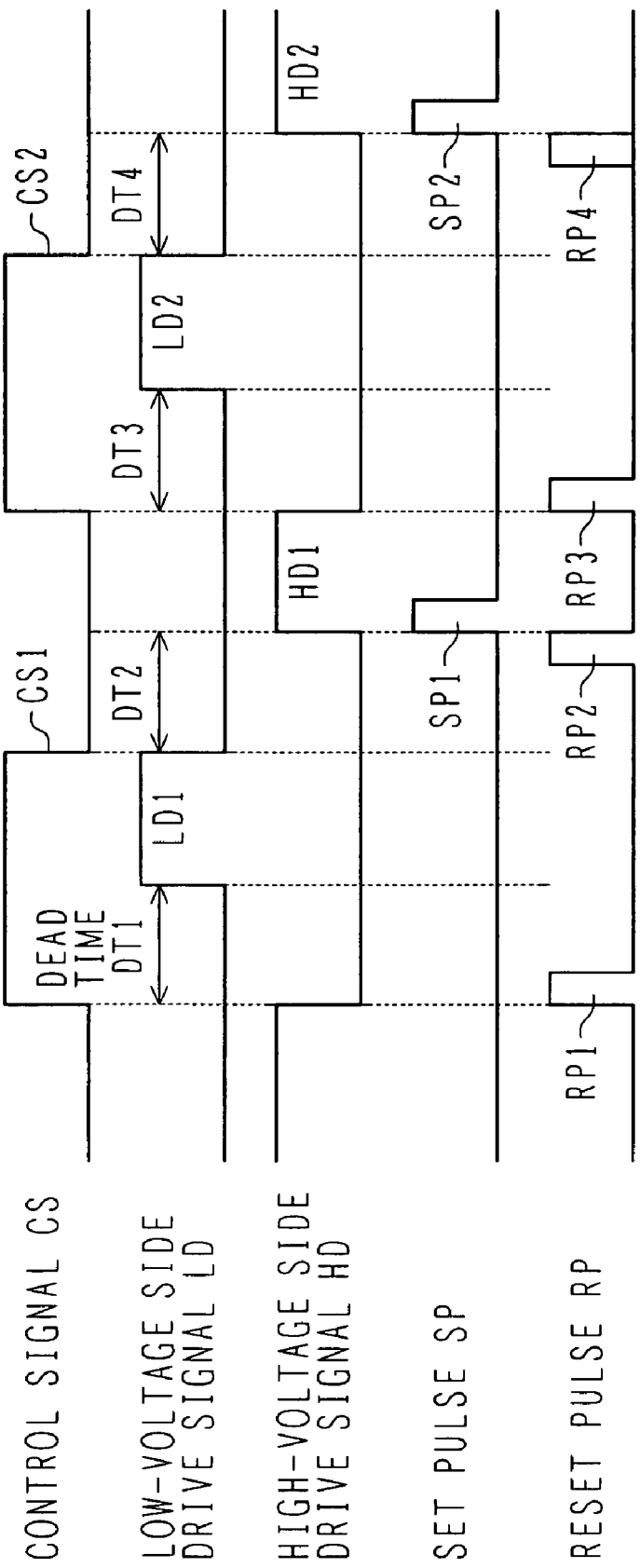
FIG. 3 is a level shift operation timing diagram according to a second embodiment of the present invention.

FIG. 3 is a level shift operation timing diagram according to the second embodiment of the present invention. The second embodiment is equal to the first embodiment in the overall configuration of the motor drive device based on a power IGBT drive circuit and the power conversion device.

The basic operation of the second embodiment is the same as that of the first embodiment. However, the pulse generation circuit 23 according to the second embodiment generates reset pulses RP2 and RP4 immediately before set pulses SP1 and SP2 during dead times DT2 and DT4.

Consequently, even if the high-voltage side IGBT 3 turns ON during dead time DT2 or DT4, it can be immediately turned OFF. This makes it possible to prevent the high-voltage side IGBT 3 from prematurely turning ON and avoid controllability deterioration.

Third Embodiment

A third embodiment of the present invention will now be described with reference to FIG. 4.

Figure 4:
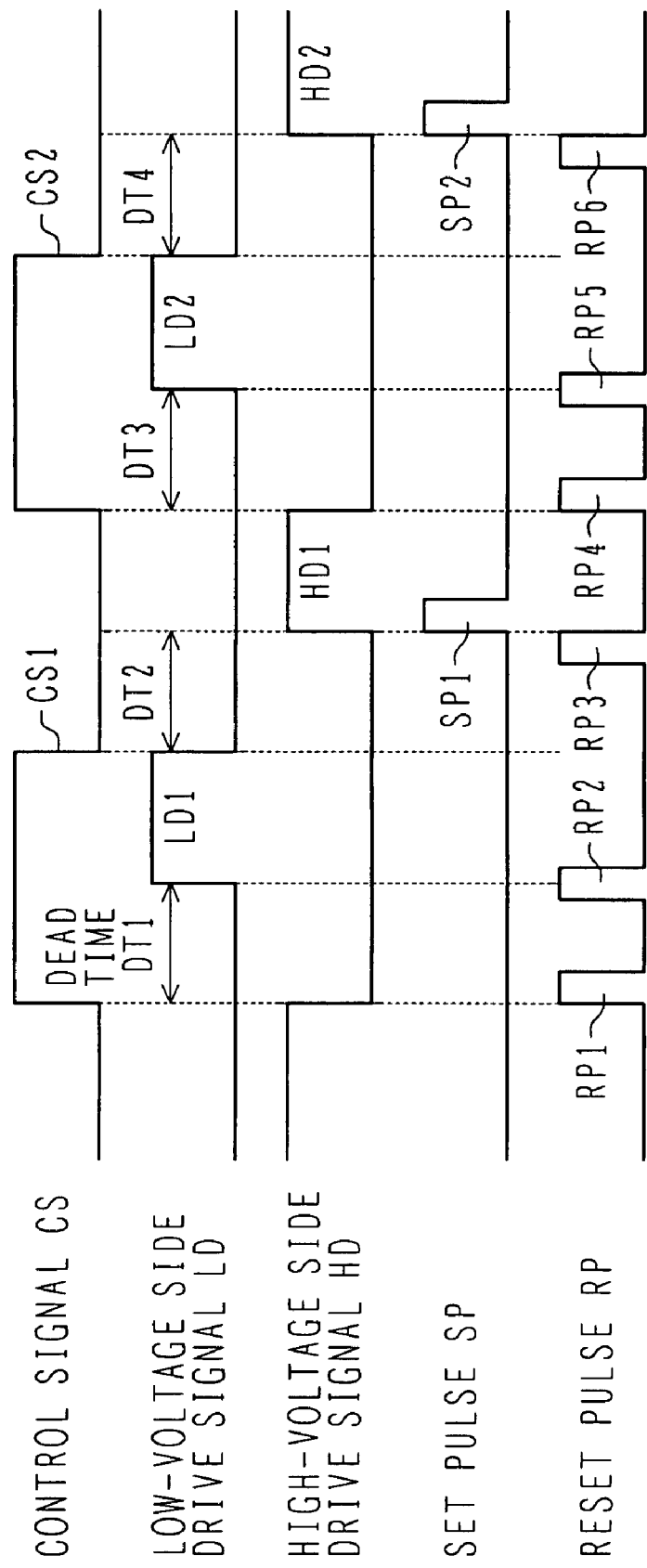
FIG. 4 is a level shift operation timing diagram according to a third embodiment of the present invention.

FIG. 4 is a level shift operation timing diagram according to the third embodiment of the present invention. The third embodiment is equal to the first embodiment in the overall configuration of the motor drive device based on a power semiconductor element drive circuit and the power conversion device.

The basic operation of the third embodiment is the same as that of the first embodiment. Reset pulses RP2 and RP5 are generated immediately before the low-voltage side IGBT 4 turns ON, and an OFF instruction is output to the high-voltage side IGBT 3.

In addition, the third embodiment generates reset pulses RP3 and RP6 immediately before set pulses SP1 and SP2. This makes it possible to prevent an upper/lower arm short circuit and avoid controllability deterioration even if a malfunction occurs during dead time DT1, DT2, DT3, or DT4.

Fourth Embodiment

A fourth embodiment of the present invention will now be described with reference to FIG. 5.

Figure 5:
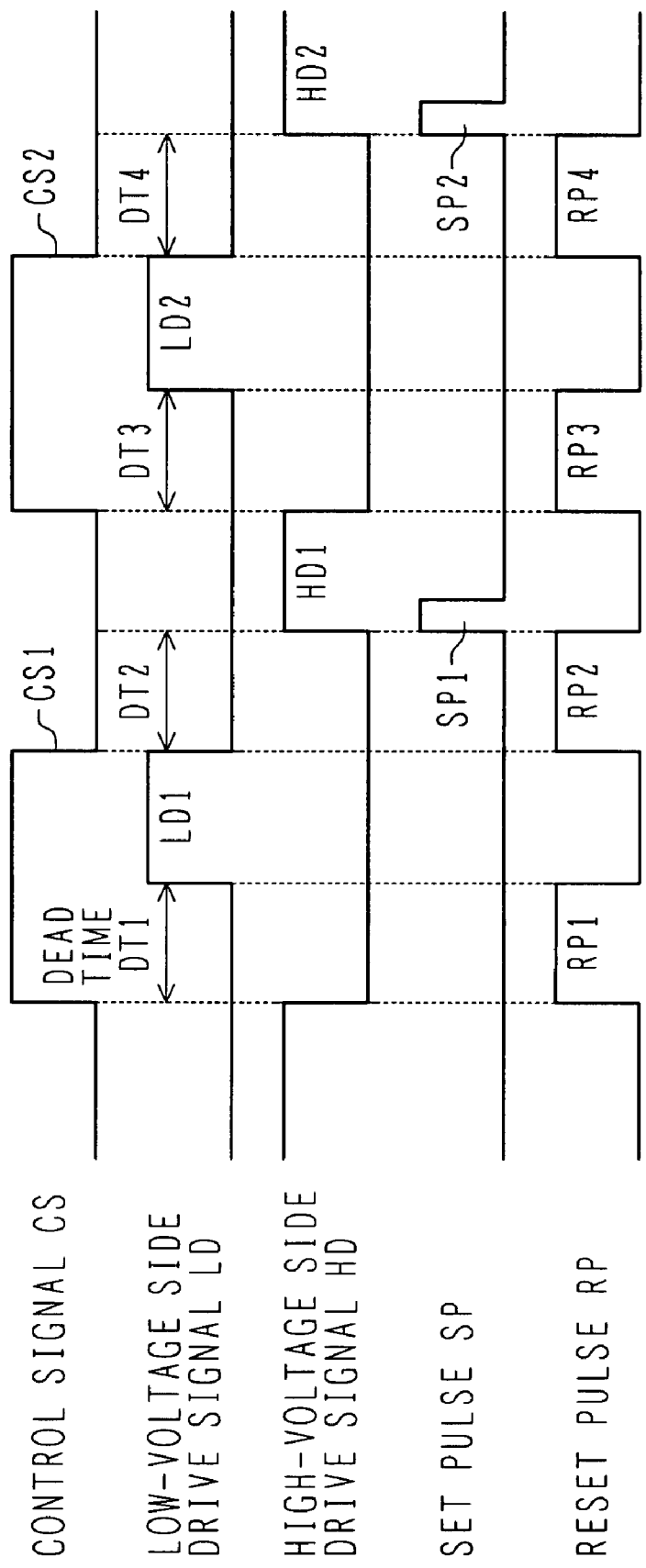
FIG. 5 is a level shift operation timing diagram according to a fourth embodiment of the present invention.

FIG. 5 is a level shift operation timing diagram according to the fourth embodiment of the present invention. The fourth embodiment is equal to the first embodiment in the overall configuration of the motor drive device based on a power semiconductor element drive circuit and the power conversion device.

The fourth embodiment continuously outputs reset pulses RP1 to RP4 during all dead times DT1-DT4. This ensures that the logic filter 14 shuts off an incorrect signal even if the level shift circuit 16 malfunctions due, for instance, to a potential change dV/dt at the series connection point 7 between IGBTs 3 and 4 during dead time DT. Consequently, it is possible to prevent an upper/lower arm short circuit and avoid controllability deterioration even if a malfunction occurs during all dead times DT1-DT4.

Fifth Embodiment

A fifth embodiment of the present invention will now be described with reference to FIG. 6.

Figure 6:
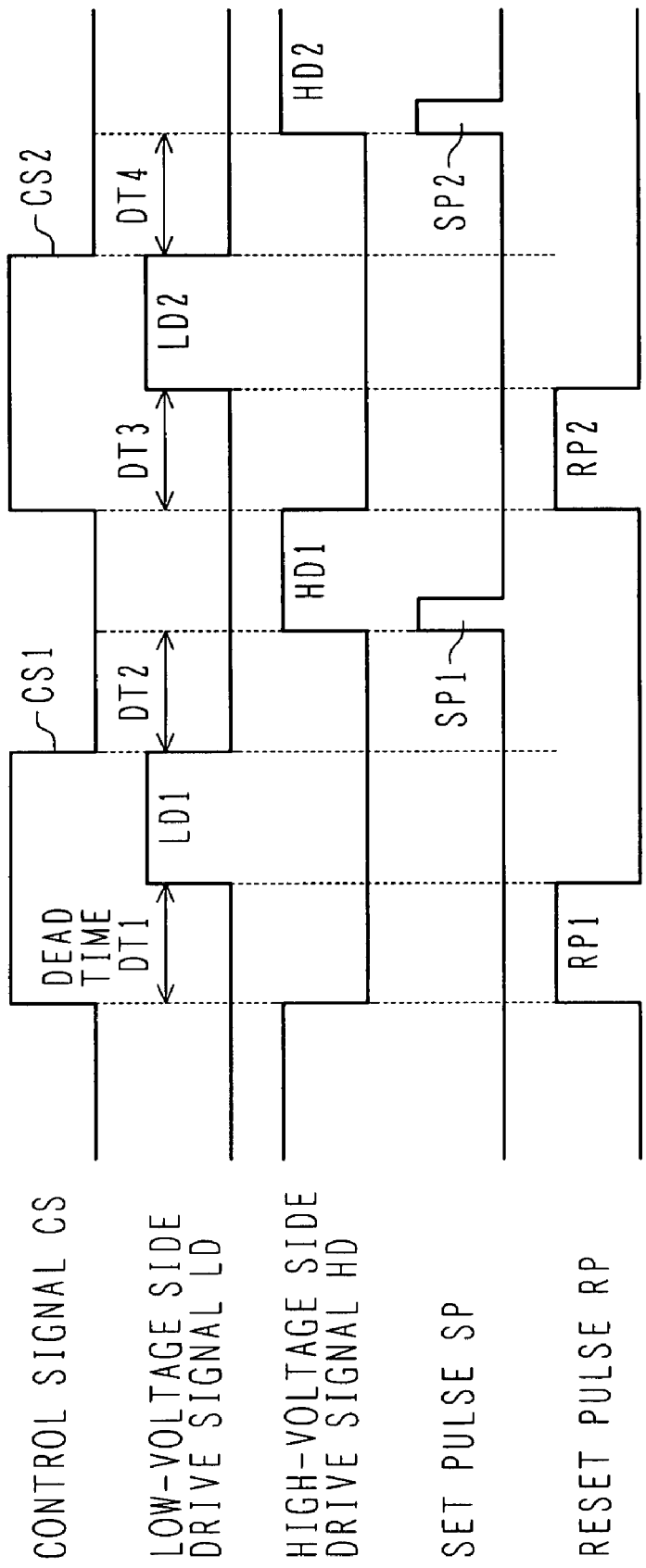
FIG. 6 is a level shift operation timing diagram according to a fifth embodiment of the present invention.

FIG. 6 is a level shift operation timing diagram according to the fifth embodiment of the present invention. The fifth embodiment is equal to the first embodiment in the overall configuration of the motor drive device based on a power semiconductor element drive circuit and the power conversion device.

In the fifth embodiment, the pulse generation circuit 23 continuously outputs reset pulses RP1 and RP2 during dead times DT1 and DT3 during which the high- and low-voltage side IGBTs 3, 4 are both OFF immediately before the low-voltage side IGBT 4 turns ON.

Consequently, the fifth embodiment makes it possible to prevent an upper/lower arm short circuit even if a malfunction occurs due, for instance, to a potential change dV/dt at the series connection point 7 between IGBTs 3 and 4 during dead time DT1 or DT3. Further, the fifth embodiment consumes less power than the fourth embodiment.

Sixth Embodiment

Figure 7:
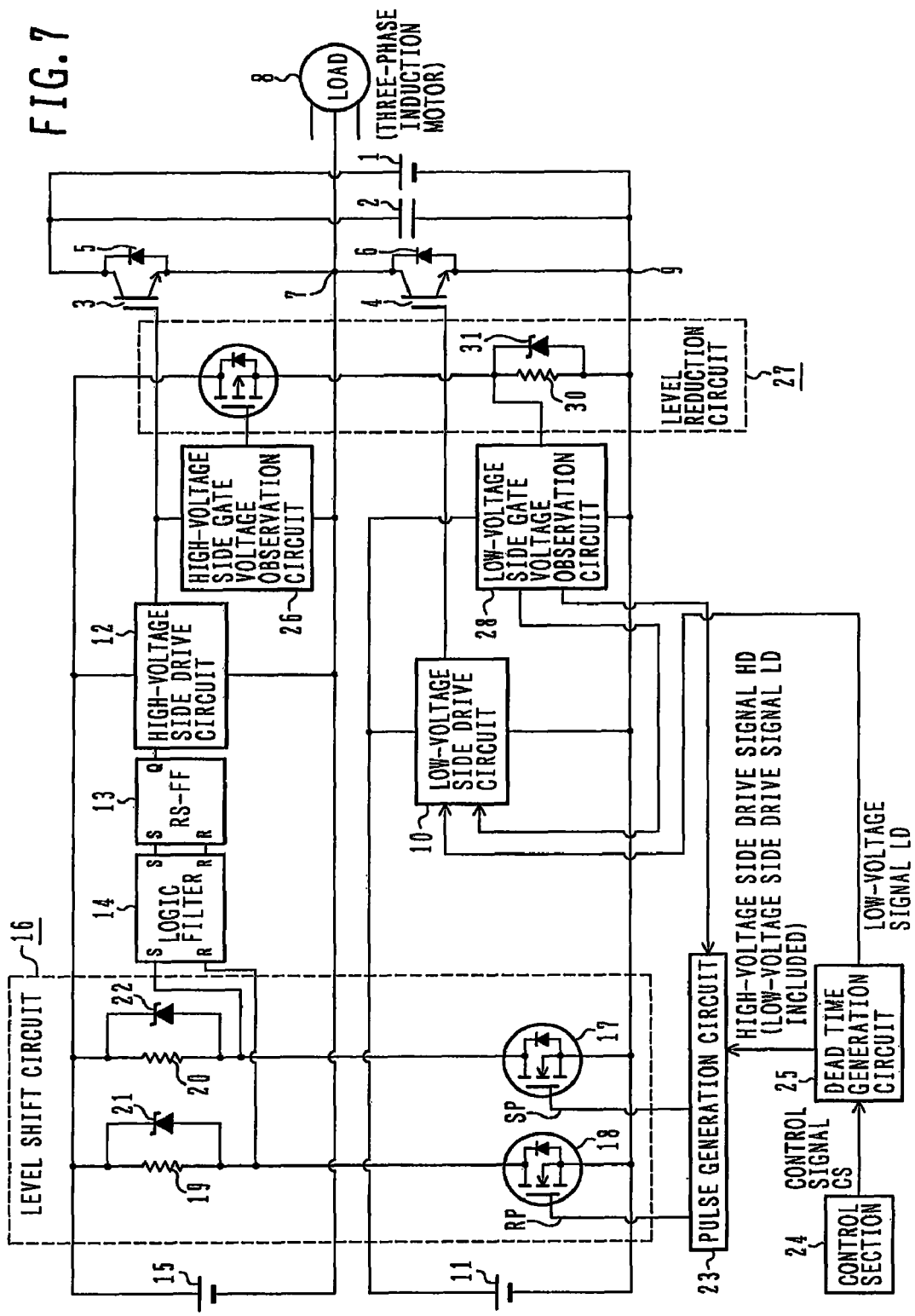
FIG. 7 shows the overall configuration of a motor drive device that uses a power semiconductor element drive circuit according to a sixth embodiment of the present invention.

FIG. 7 illustrates the overall configuration of a motor drive device that uses a power semiconductor element drive circuit according to a sixth embodiment of the present invention. The sixth embodiment of the present invention will now be described while omitting descriptions that overlap with those of the first embodiment.

A high-voltage side gate voltage observation circuit 26 observes the gate voltage of the high-voltage side IGBT 3 with reference to the potential of the connection point 7 between the high-voltage side IGBT 3 and low-voltage side IGBT 4. The gate voltage of the high-voltage side IGBT 3 is then compared against a setting to judge whether the high-voltage side IGBT 3 is ON or OFF. A level reduction circuit 27 transmits the information output from the high-voltage side gate voltage observation circuit 26 to a low-voltage side gate voltage observation circuit 28, which is referenced to the ground potential 9 of the low-voltage side IGBT 4. The level reduction circuit 27 includes a pMOS-FET 29, a resistor 30, and a Zener diode 31. When the high-voltage side gate voltage observation circuit 26 generates an output, the pMOS-FET 29 conducts to develop a voltage across the resistor 30 and transmit the ON/OFF information about the high-voltage side IGBT 3 to the low-voltage side gate voltage observation circuit 28. The Zener diode 31 protects peripheral circuits against overvoltage.

The information transmitted to the low-voltage side gate voltage observation circuit 28 enters the low-voltage side drive circuit 10 and pulse generation circuit 23.

When the high-voltage side IGBT 3 is ON, the low-voltage side drive circuit 10 shuts off the ON instruction for the low-voltage side IGBT 4 for invalidation purposes. The pulse generation circuit 23 continuously outputs a reset pulse RP when the high-voltage side IGBT 3 is ON although the high-voltage side drive signal HD is Low (OFF instruction for the high-voltage side IGBT 3).

Figure 8:
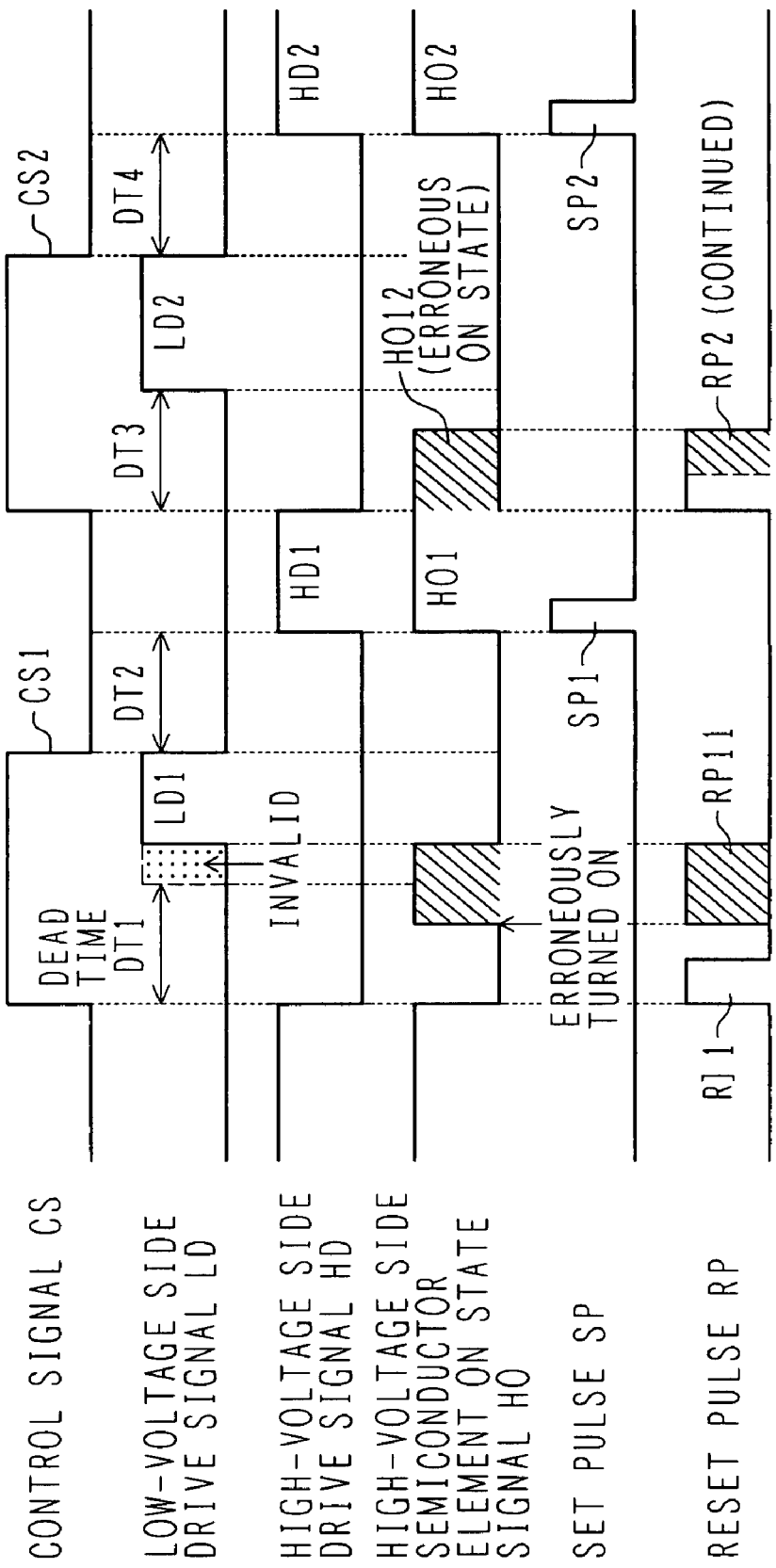
FIG. 8 is a level shift operation timing diagram according to a sixth embodiment of the present invention.

FIG. 8 is an operation timing diagram illustrating the semiconductor element drive device according to the sixth embodiment of the present invention.

If, for instance, the high-voltage side IGBT 3 erroneously turns ON to generate its ON state signal HO11, the low-voltage side drive circuit 10 invalidates low-voltage side drive signal LD1 to shut off the ON instruction for the low-voltage side IGBT 4 because the high-voltage side IGBT 3 is ON.

The pulse generation circuit 23 continuously outputs reset pulse RP2 when the high-voltage side IGBT 3 is ON with a signal H012 generated to indicate an erroneous ON state although the high-voltage side drive signal HD is Low (OFF instruction for the high-voltage side IGBT 3).

As described above, the sixth embodiment includes a high-voltage side IGBT monitoring circuit 26 for monitoring the ON/OFF status of the high-voltage side IGBT 3 with reference to the potential of the series connection point 7 between IGBTs 3 and 4, and circuit means for invalidating ON instruction LD1 for the low-voltage IGBT 4 when the high-voltage side IGBT monitoring circuit 26 observes the ON state of the high-voltage side IGBT 3.

The sixth embodiment also includes circuit means for maintaining reset pulse RP2 when the high-voltage side IGBT monitoring circuit 26 observes the ON state of the high-voltage side IGBT 3 to generate an erroneous ON state signal H012 even after the drive signal HD1 for the high-voltage side IGBT 3 turns OFF.

The above features make it possible to prevent an upper/lower arm short circuit.

The present invention can be used as a semiconductor element drive circuit, power conversion device, or motor drive device in all fields. For example, the present invention can be applied to industrial robots, railroad devices, and household electrical appliances. The present invention is particularly suitable, for instance, as a vehicle-mounted semiconductor element drive circuit, power conversion device, and motor drive device, which are expected to exhibit high reliability and high withstand voltage.

What is claimed is:
1. A semiconductor element drive device comprising:
two semiconductor elements which are series-connected between main power supply terminals;
a low-voltage side drive circuit for driving a low-voltage side semiconductor element, which is one of said two semiconductor elements, with reference to a ground potential of the low-voltage side semiconductor element;
a high-voltage side drive circuit for driving a high-voltage side semiconductor element with reference to a potential of a series connection point between said semiconductor elements;
a pulse generation circuit for generating a set pulse signal and a reset pulse signal, which serve as an ON instruction and an OFF instruction for the high-voltage side semiconductor element, with reference to the ground potential of the low-voltage side semiconductor element; and
a level shift circuit for shifting the levels of the set pulse signal and reset pulse signal toward a high-voltage side with reference to the potential of the series connection point and transmitting the resulting set pulse signal and reset pulse signal to said high-voltage side drive circuit;
said two semiconductor elements being turned ON/OFF before and after dead time during which the semiconductor elements are both OFF, and alternative current is output,
wherein said pulse generation circuit continues to output the ON time of the reset pulse signal during the entirety of the dead time during which the high and low voltage side semiconductor are both OFF to said level shift circuit, and
wherein the reset pulse has the same duration as the dead time.

2. The semiconductor element drive device according to claim 1, wherein a dead time generation is provided in a low-side circuit.

3. A semiconductor element drive device comprising:
two semiconductor elements which are series-connected between main power supply terminals;
a low-voltage side drive circuit for driving a low-voltage side semiconductor element, which is one of said two semiconductor elements, with reference to a ground potential of the low-voltage side semiconductor element;
a high-voltage side drive circuit for driving a high-voltage side semiconductor element with reference to a potential of a series connection point between said semiconductor elements;
a pulse generation circuit for generating a set pulse signal and a reset pulse signal, which serve as an ON instruction and an OFF instruction for the high-voltage side semiconductor element, with reference to the ground potential of the low-voltage side semiconductor element; and
a level shift circuit for shifting the levels of the set pulse signal and reset pulse signal toward a high-voltage side with reference to the potential of the series connection point and transmitting the resulting set pulse signal and reset pulse signal to said high-voltage side drive circuit;
said two semiconductor elements being turned ON/OFF before and after dead time during which the semiconductor elements are both OFF, and alternative current is output,
wherein said pulse generation circuit ON time of the reset pulse continues to output the reset pulse signal during the entirety of the dead time during which the high and low voltage side semiconductor are both OFF to said level shift circuit during the dead time during which the high- and low-voltage side semiconductor elements are both OFF closely before the low-voltage side semiconductor element turns ON, and wherein the reset pulse has the same duration as the dead time.

4. The semiconductor element drive device according to claim 3, wherein a dead time generation is provided in a low-side circuit.

5. A semiconductor element drive method comprising the steps of:
   driving a low-voltage side semiconductor element, which is one of two semiconductor elements which are series-connected between main power supply terminals, with reference to a ground potential of the low-voltage side semiconductor element;
   driving a high-voltage side semiconductor element by a high-voltage side drive circuit which is referenced to a potential of a series connection point between the semiconductor elements;
   generating a set pulse signal and a reset pulse signal, which serve as an ON instruction and an OFF instruction for the high-voltage side semiconductor element, with reference to the ground potential of the low-voltage side semiconductor element;
   shifting the levels of the set pulse signal and reset pulse signal toward a high-voltage side which is referenced to the potential of the series connection point and transmitting the resulting set pulse signal and reset pulse signal to the high-voltage side drive circuit; and
   turning ON/OFF the two semiconductor elements before and after dead time during which the semiconductor elements are both OFF, and alternative current is output;
   wherein a reset pulse for level-shifting the reset pulse signal is kept ON time during output of the entirety of the dead time during which the high- and low-voltage side semiconductor elements are both OFF, and
   wherein the reset pulse has the same duration as the dead time.

6. The semiconductor element drive method according to claim 5, wherein a dead time generation is provided in a low-side circuit.

7. A semiconductor element drive method comprising the steps of:
   driving a low-voltage side semiconductor element, which is one of two semiconductor elements which are series-connected between main power supply terminals, with reference to a ground potential of the low-voltage side semiconductor element;
   driving a high-voltage side semiconductor element by a high-voltage side drive circuit which is referenced to a potential of a series connection point between the semiconductor elements;
   generating a set pulse signal and a reset pulse signal, which serve as an ON instruction and an OFF instruction for the high-voltage side semiconductor element, with reference to the ground potential of the low-voltage side semiconductor element;
   shifting the levels of the set pulse signal and reset pulse signal toward a high-voltage side which is referenced to the potential of the series connection point and transmitting the resulting set pulse signal and reset pulse signal to the high-voltage side drive circuit; and
   turning ON/OFF the two semiconductor elements before and after dead time during which the semiconductor elements are both OFF, and alternative current is output;
   wherein a reset pulse for level-shifting the reset pulse signal is kept ON time during output of the entirety of the dead time during which the high- and low-voltage side semiconductor elements are both OFF closely before the low-voltage side semiconductor element turns ON, and
   wherein the reset pulse has the same duration as the dead time.

8. The semiconductor element drive method according to claim 7, wherein a dead time generation is provided in a low-side circuit.

* * * * *